(12) United States Patent
Yuan

(10) Patent No.: US 7,517,756 B2
(45) Date of Patent: Apr. 14, 2009

(54) FLASH MEMORY ARRAY WITH INCREASED COUPLING BETWEEN FLOATING AND CONTROL GATES

(75) Inventor: Jack H. Yuan, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/668,306

(22) Filed: Jan. 29, 2007

(65) Prior Publication Data

US 2007/0122980 A1 May 31, 2007

Related U.S. Application Data

(60) Continuation of application No. 11/132,522, filed on May 18, 2005, now Pat. No. 7,170,131, which is a division of application No. 10/268,635, filed on Oct. 9, 2002, now Pat. No. 6,908,817.

(51) Int. Cl.
    *H01L 21/336* (2006.01)
(52) U.S. Cl. .................. 438/257; 257/E21.679
(58) Field of Classification Search ............... 438/257, 438/E21.679; 257/315, E29.304
    See application file for complete search history.

(56) References Cited

U.S. PATENT DOCUMENTS

| 5,043,940 A | 8/1991 | Harari |
| 5,070,032 A | 12/1991 | Yuan et al. |
| 5,095,344 A | 3/1992 | Harari |
| 5,168,465 A | 12/1992 | Harari |
| 5,172,338 A | 12/1992 | Mehrotra et al. |
| 5,198,380 A | 3/1993 | Harari |
| 5,268,318 A | 12/1993 | Harari |
| 5,268,319 A | 12/1993 | Harari |
| 5,297,148 A | 3/1994 | Harari et al. |

(Continued)

FOREIGN PATENT DOCUMENTS

DE 196 17 632 A1 7/1997

(Continued)

OTHER PUBLICATIONS

"Notification of the Transmittal of the International Search Report or the Declaration" corresponding PCT application PCT/US03/32119, International Searching Authority, European Patent Office, Jun. 22, 2004, 8 pages.

(Continued)

*Primary Examiner*—Bradley K Smith
(74) *Attorney, Agent, or Firm*—Vierra Magen Marcus & DeNiro LLP

(57) ABSTRACT

Floating gate structures are disclosed which have a base field coupled with the substrate and a narrow projection extending from the base away from the substrate. In one form, surfaces of a relatively large projection provide an increased surface area for a control gate that wraps around it, thereby increasing the coupling between the two. In another form, an erase gate wraps around a relatively small projection in order to take advantage of sharp edges of the projection to promote tunneling of electrons from the floating to the erase gate. In each case, the control or floating gate is positioned within the area of the floating gate in one direction, thereby not requiring additional substrate area for such memory cells.

9 Claims, 6 Drawing Sheets

U.S. PATENT DOCUMENTS

| | | |
|---|---|---|
| 5,313,421 A | 5/1994 | Guterman et al. |
| 5,315,541 A | 5/1994 | Harari et al. |
| 5,343,063 A | 8/1994 | Yuan et al. |
| 5,380,672 A | 1/1995 | Yuan |
| 5,389,808 A | 2/1995 | Arai |
| 5,459,091 A | 10/1995 | Hwang |
| 5,512,505 A | 4/1996 | Yuan |
| 5,534,456 A | 7/1996 | Yuan |
| 5,554,553 A | 9/1996 | Yuan |
| 5,579,259 A | 11/1996 | Samachisa |
| 5,595,924 A | 1/1997 | Yuan |
| 5,640,032 A | 6/1997 | Tomioka |
| 5,654,217 A | 8/1997 | Yuan |
| 5,661,053 A | 8/1997 | Yuan |
| 5,677,872 A | 10/1997 | Samachisa |
| 5,712,179 A | 1/1998 | Yuan |
| 5,712,180 A | 1/1998 | Guterman et al. |
| 5,716,863 A | 2/1998 | Arai |
| 5,747,359 A | 5/1998 | Yuan |
| 5,756,385 A | 5/1998 | Yuan |
| 5,786,988 A | 7/1998 | Harari |
| 5,817,580 A | 10/1998 | Violette |
| 5,847,425 A | 12/1998 | Yuan |
| 5,867,429 A | 2/1999 | Chen |
| 5,883,409 A | 3/1999 | Guterman |
| 5,923,976 A | 7/1999 | Kim |
| 5,965,913 A | 10/1999 | Yuan |
| 5,966,618 A | 10/1999 | Sun et al. |
| 5,981,335 A | 11/1999 | Chi |
| 5,999,448 A | 12/1999 | Kurihara |
| 6,028,336 A | 2/2000 | Yuan |
| 6,046,935 A | 4/2000 | Takeuchi et al. |
| 6,060,360 A | 5/2000 | Lin et al. |
| 6,103,573 A | 8/2000 | Harari et al. |
| 6,133,093 A | 10/2000 | Prinz et al. |
| 6,151,248 A | 11/2000 | Harari et al. |
| 6,172,395 B1 | 1/2001 | Chen et al. |
| 6,184,093 B1 | 2/2001 | Sung |
| 6,208,545 B1 | 3/2001 | Leedy |
| 6,222,762 B1 | 4/2001 | Guterman et al. |
| 6,235,586 B1 | 5/2001 | Au |
| 6,258,665 B1 | 7/2001 | Shimizu |
| 6,281,075 B1 | 8/2001 | Yuan et al. |
| 6,281,077 B1 | 8/2001 | Patelmo et al. |
| 6,295,227 B1 | 9/2001 | Sakui et al. |
| 6,297,097 B1 * | 10/2001 | Jeong .................. 438/264 |
| 6,326,263 B1 | 12/2001 | Hsieh |
| 6,365,525 B2 | 4/2002 | Miller |
| 6,391,722 B1 | 5/2002 | Koh |
| 6,417,051 B1 | 7/2002 | Takebuchi |
| 6,417,538 B1 | 7/2002 | Choi |
| 6,448,126 B1 | 9/2002 | Lai et al. |
| 6,455,440 B1 | 9/2002 | Jeng |
| 6,461,973 B1 | 10/2002 | Hui et al. |
| 6,465,323 B1 | 10/2002 | Yu et al. |
| 6,483,146 B2 | 11/2002 | Lee et al. |
| 6,512,263 B1 | 1/2003 | Yuan |
| 6,529,410 B1 | 3/2003 | Han et al. |
| 6,544,431 B2 | 4/2003 | Gill et al. |
| 6,548,374 B2 | 4/2003 | Chung |
| 6,559,008 B2 | 5/2003 | Rabkin et al. |
| 6,562,682 B1 | 5/2003 | Chiu et al. |
| 6,614,684 B1 | 9/2003 | Shukuri et al. |
| 6,620,681 B1 | 9/2003 | Kim et al. |
| 6,689,653 B1 | 2/2004 | Seah et al. |
| 6,762,092 B2 | 7/2004 | Yuan |
| 6,768,161 B2 | 7/2004 | Kinoshita |
| 6,770,932 B2 | 8/2004 | Himeno et al. |
| 6,791,142 B2 | 9/2004 | Tseng |
| 6,794,708 B2 | 9/2004 | Mori |
| 6,815,755 B2 | 11/2004 | Colclaser et al. |
| 6,853,037 B2 | 2/2005 | Kudo et al. |
| 6,891,246 B2 | 5/2005 | Aritome |
| 6,894,930 B2 | 5/2005 | Chien et al. |
| 6,897,524 B2 | 5/2005 | Kamiya |
| 6,908,817 B2 | 6/2005 | Yuan |
| 7,023,049 B2 | 4/2006 | Takebuchi et al. |
| 2001/0001491 A1 | 5/2001 | Sakui |
| 2002/0048897 A1 | 4/2002 | Hong |
| 2002/0072197 A1 | 6/2002 | Kang et al. |
| 2002/0093073 A1 | 7/2002 | Mori et al. |
| 2002/0197800 A1 | 12/2002 | Hashimoto et al. |
| 2003/0015497 A1 | 1/2003 | Gill et al. |
| 2003/0029839 A1 | 2/2003 | Chou |
| 2004/0084713 A1 | 5/2004 | Hsieh |
| 2005/0199939 A1 | 9/2005 | Lutze et al. |

FOREIGN PATENT DOCUMENTS

| | | |
|---|---|---|
| EP | 1274132 | 1/2003 |
| EP | 1363324 | 11/2003 |
| JP | 5-190809 A | 7/1993 |
| JP | 2001-135736 | 5/2001 |

OTHER PUBLICATIONS

International Search Report, PCT/US03/18183 filed Sep. 6, 2003.

Y. Takeuchi et al., "A Self-Aligned STI Process Integration for Low Cost and Highly Reliable 1Gbit Flash Memories," *1998 Symposium on VLSI Technology—Digest of Technical Papers*, Jun. 9-11, 1998, pp. 102.

Seiichi Aritome, "Advanced Flash Memory Technology and Trends for File Storage Application," *2000 International Electron Devices Meeting*, Dec. 10-13, 2000, pp. 33.1.1-33.1.4.

"Planarized NVRAM Cell with Self-Aligned BL-BL and WL-BL Isolations", IBM Technical Disclosure Bulletin, IBM Corp. New York, US, vol. 36, No. 2, Feb. 1, 1993, pp. 375-377.

Chan et al., "A True Single-Transistor Oxide-Nitride-Oxide EEPROM Device," IEEE Electron Device Letters, vol. EDL-8, No. 3, Mar. 1987, pp. 93-95.

DiMaria et al., "Electrically-Alterable Read-Only-Memory Using Si-rich SiO2 Injectors and a Floating Polycrystalline Silicon Storage Layer," J. Appl. Phys. 52(7), Jul. 1981, pp. 4825-4842.

Eitan et al., "NROM: A Novel Localized Trapping, 2-Bit Nonvolatile Memory Cell," IEEE Electron Device Letters, vol. 21. No. 11, Nov. 2000, pp. 543-545.

Hori et al., "A MOSFET With Si-Implanted Gate-SiO2 Insulator for Nonvolatile Memory Applications," IEDM 92, Apr. 1992, pp. 469-472.

Lee et al., "Effects of Parasitic Capacitance on NAND Flash Memory Cell Operation," IEEE Non-Volatile Semiconductor Memory Workshop, Monterey, CA, Aug. 12-16, 2001, pp. 90-92.

Nozaki et al., "A 1-Mb EEPROM with MONOS Memory Cell for Semiconductor Disk Application," IEEE Journal of Solid State Circuits, vol. 26, No. 4, Apr. 1991, pp. 497-501.

Park et al., "8Gb MLC (Multi-Level Cell) NAND Flash Memory using 63nm Process Technology," Semiconductor R & D Center, Samsung Electronics Co., Ltd, pp. 1-4.

* cited by examiner

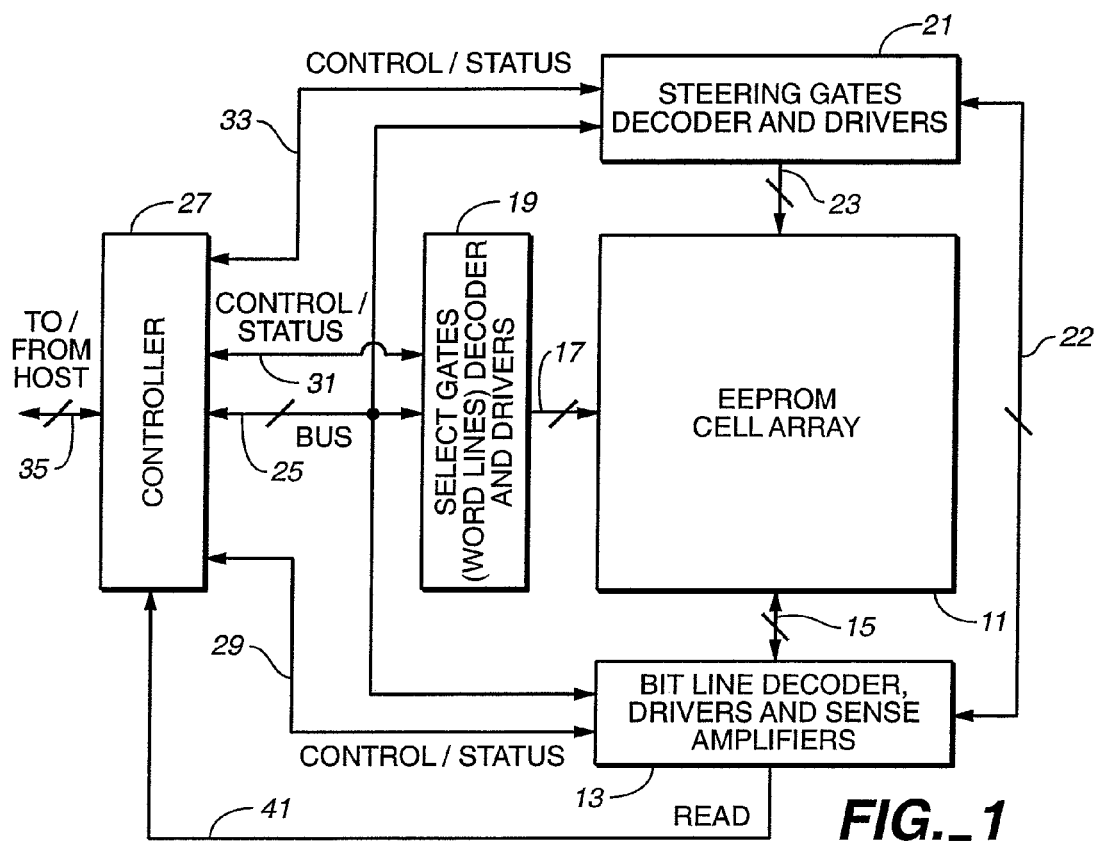
FIG._1
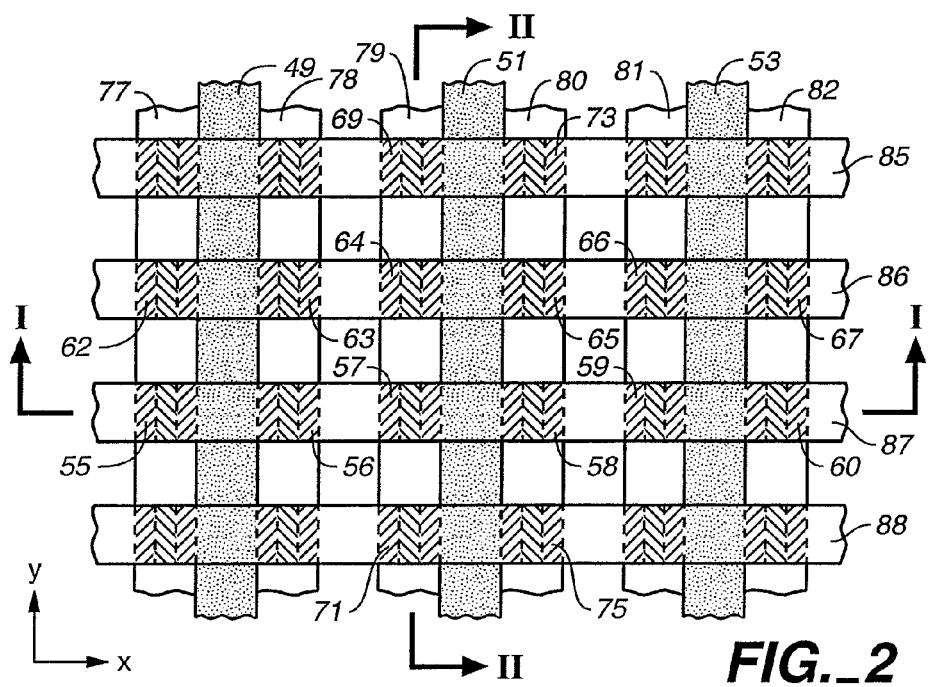
FIG._2

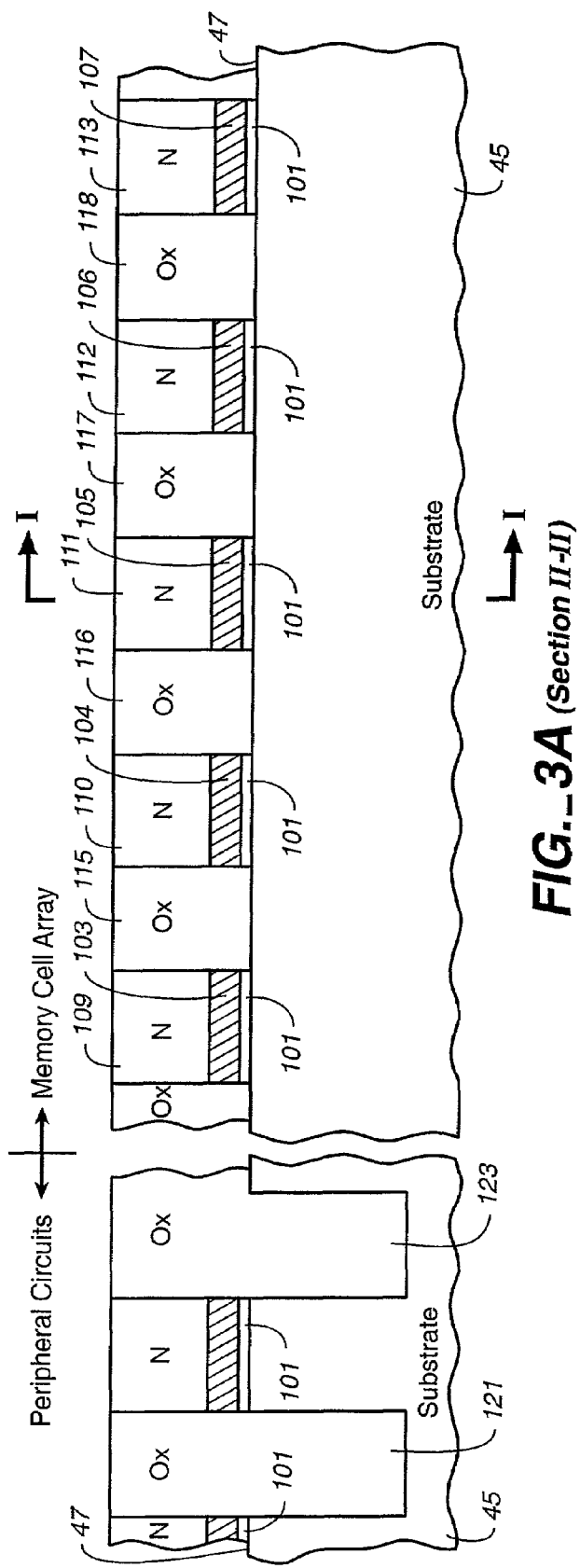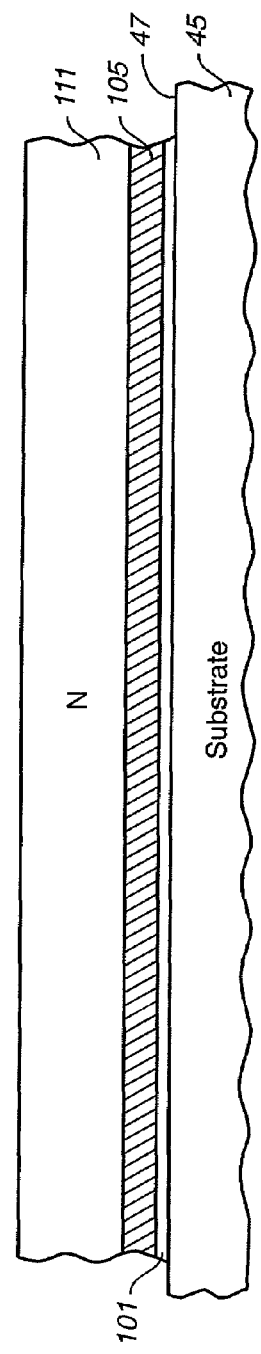
FIG._3A (Section II-II)
FIG._3B (Section I-I)

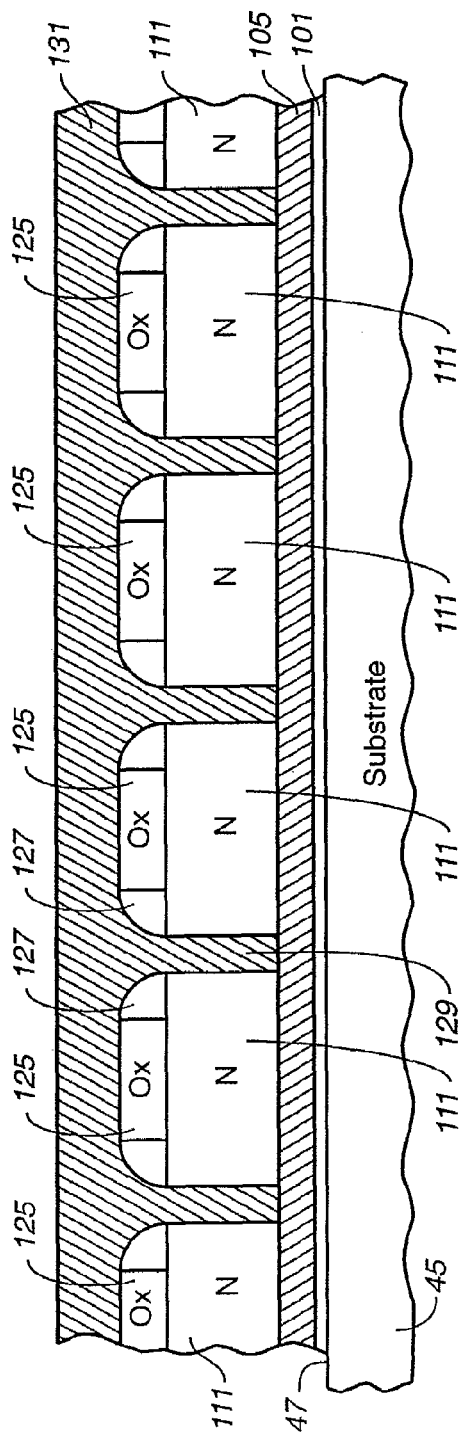
FIG._4
(Section I-I)
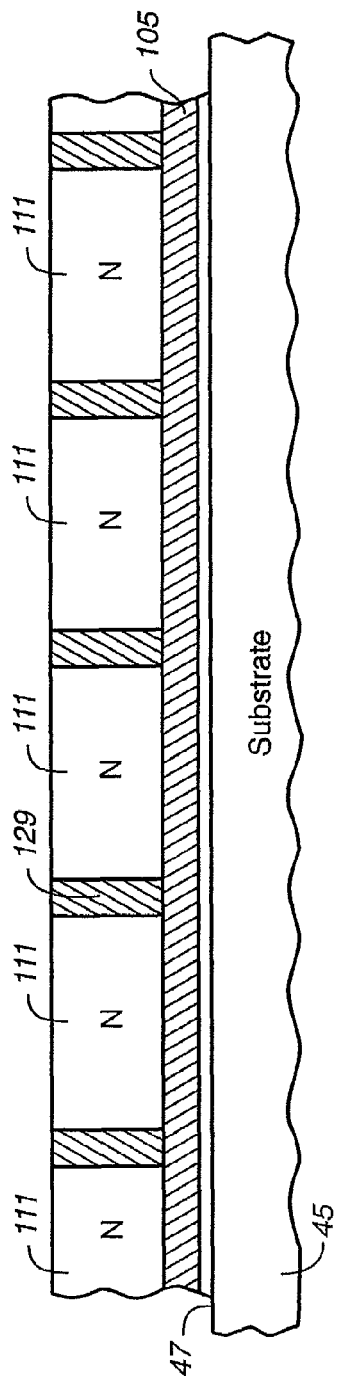
FIG._5
(Section I-I)

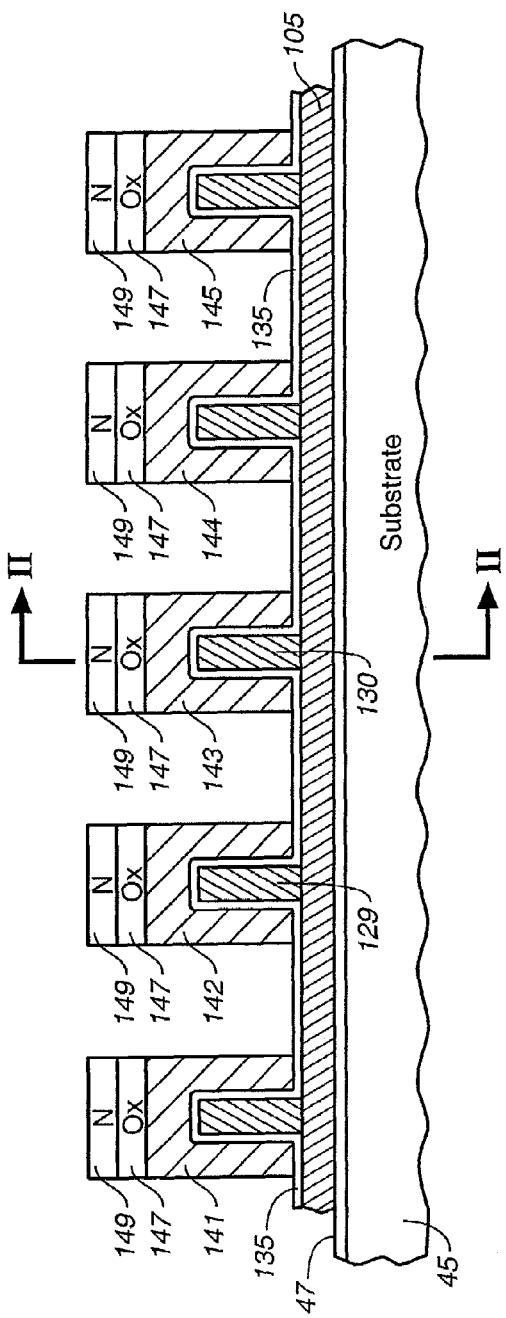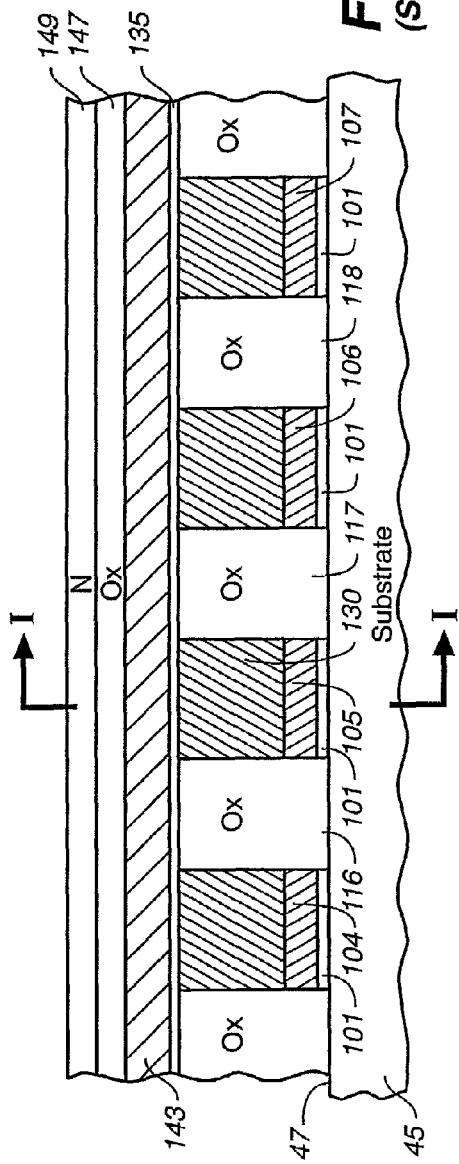

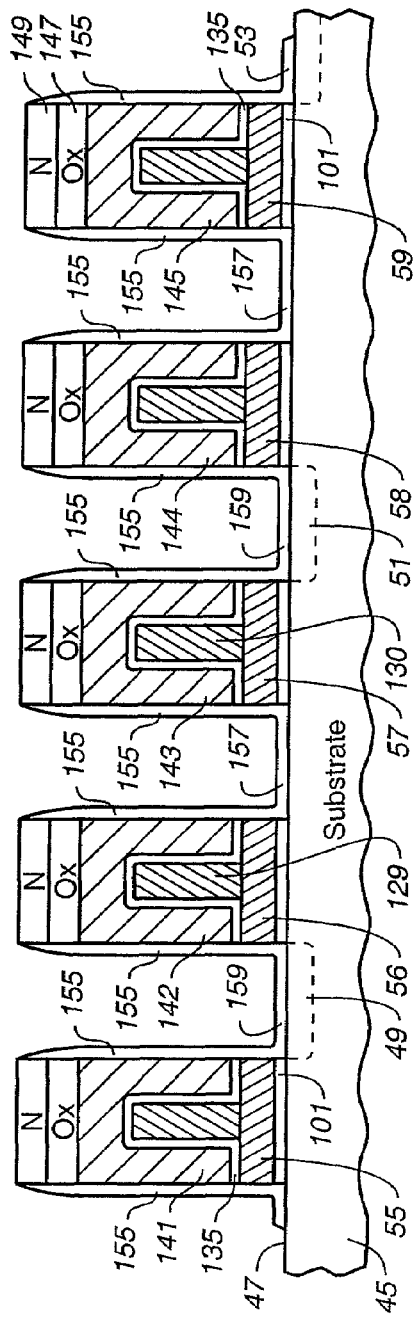
FIG._7 (Section I-I)
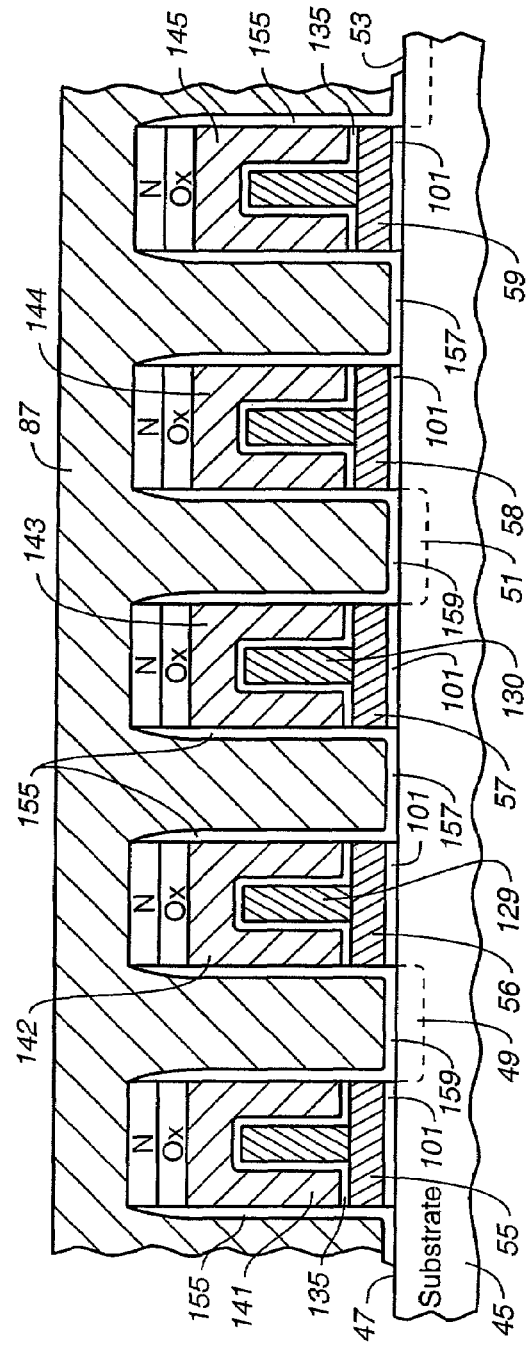
FIG._8 (Section I-I)

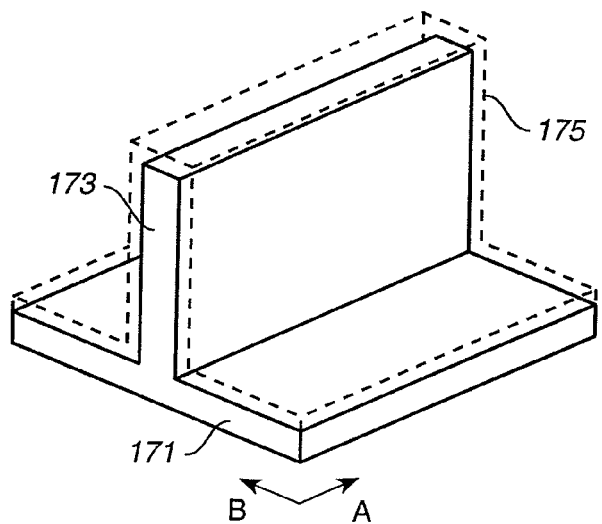
FIG._9
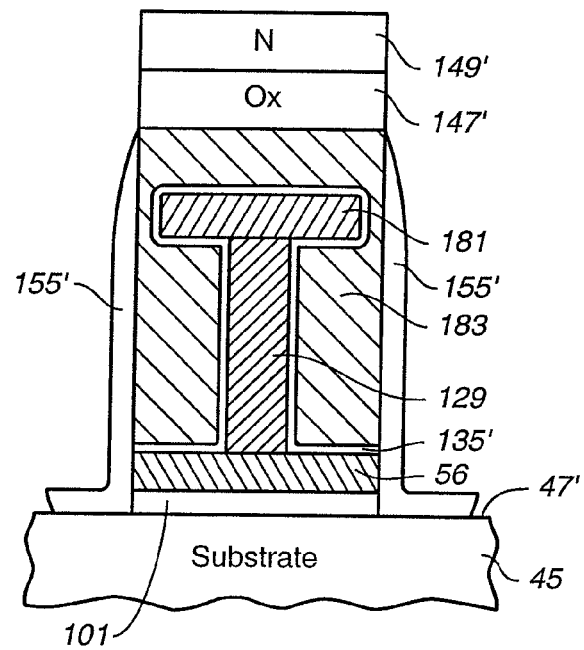
FIG._10
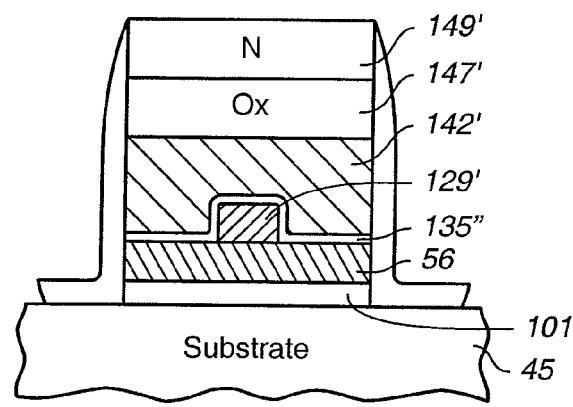
FIG._11

FLASH MEMORY ARRAY WITH INCREASED COUPLING BETWEEN FLOATING AND CONTROL GATES

CROSS-REFERENCE TO RELATED APPLICATION

This application is a continuation of application Ser. No. 11/132,522, filed May 18, 2005, now U.S. Pat. No. 7,170,131, which is a divisional of application Ser. No. 10/268,635, filed Oct. 9, 2002, now U.S. Pat. No. 6,908,817, which applications are incorporated herein in their entirety by this reference.

FIELD OF THE INVENTION

This invention relates generally to non-volatile flash memory systems, and, more specifically, to the structures of memory cells and arrays of memory cells, and to the process of forming them.

BACKGROUND

There are many commercially successful non-volatile memory products being used today, particularly in the form of small form factor cards, which use an array of flash EEPROM (Electrically Erasable and Programmable Read Only Memory) cells having a "split-channel" between source and drain diffusions. The floating gate of the cell is positioned over one portion of the channel and the word line (also referred to as a control gate) is positioned over the other channel portion as well as over the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, 5,661,053, and 6,281,075, which patents are incorporated herein by this reference.

A modification of this split-channel flash EEPROM cell adds a steering gate positioned between the floating gate and the word line. Each steering gate of an array extends over one column of floating gates, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). The use of steering gates in a flash EEPROM array is described, for example, in U.S. Pat. Nos. 5,313,421 and 6,222,762, which patents incorporated herein by this reference.

In either of the two types of memory cell arrays described above, the floating gate of a cell is programmed by injecting electrons from the substrate to the floating gate. This is accomplished by having the proper doping in the channel region and applying the proper voltages to the source, drain and remaining gate(s). So-called "source side" injection is preferred, which is also described in the foregoing U.S. Pat. No. 5,313,421.

Two techniques for removing charge from floating gates to erase memory cells are used in both of the two types of memory cell arrays described above. One is to erase to the substrate by applying appropriate voltages to the source, drain and other gate(s) that cause electrons to tunnel through a portion of a dielectric layer between the floating gate and the substrate. The other erase technique is to transfer electrons from the floating gate to another gate through a tunnel dielectric layer positioned between them. In the first type of cell described above, a third erase gate is provided for that purpose. In the second type of cell described above, which already has three gates because of the use of a steering gate, the floating gate is erased to the word line, without the necessity to add a fourth gate. Although this later technique adds back a second function to be performed by the word line, these functions are performed at different times, thus avoiding the necessity of making a compromise because of the two functions. When either erase technique is utilized, a large number of memory cells are grouped together for simultaneously erasure, in a "flash." In one approach, the group includes enough memory cells to store the amount of user data stored in a disk sector, namely 512 bytes, plus some overhead data. In another approach, each group contains enough cells to hold several thousand bytes of user data, equal to many disk sectors' worth of data. Multi-block erasure, defect management and other flash EEPROM system features are described in U.S. Pat. No. 5,297,148, which patent is incorporated herein by this reference.

As in most all integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner, since there is often at least one feature that is limited as to how much it can be shrunk, thus limiting the amount that the overall layout can be shrunk. When this happens, designers will turn to a new or different layout or architecture of the circuit being implemented in order to reduce the amount of silicon area required to perform its functions. The shrinking of the above-described flash EEPROM integrated circuit systems can reach similar limits.

Therefore, in order to further increase data storage density, a flash EEPROM system using a dual floating gate memory cell is being utilized along with the storage of multiple states on each floating gate. In this type of cell, two floating gates are included over its channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised sufficiently high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. Examples of this cell array architecture and operating techniques are described in U.S. Pat. Nos. 5,712,180, 6,103,573 and 6,151,248, which patents are expressly incorporated herein in their entirety by this reference.

Another flash EEPROM architecture utilizes a NAND array, wherein series strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. An example of a NAND architecture array and its operation as part of a memory system is found in U.S. Pat. No. 6,046,935, which patent is incorporated herein in its entirety by this reference.

In these and other types of non-volatile memories, the amount of field coupling between the floating gates and the control gates passing over them is carefully controlled. The amount of coupling determines the percentage of a voltage placed on the control gate that is coupled to its floating gates. The percentage coupling is determined by a number of factors including the amount of surface area of the floating gate that overlaps a surface of the control gate. It is often desired to maximize the percentage coupling between the floating and control gates by maximizing the amount of overlapping area. One approach to increasing coupling area is described in U.S. Pat. No. 5,343,063, which patent is incorporated herein in its entirety by this reference. The approach described in that patent is to make the floating gates thicker than usual to provide large vertical surfaces that may be coupled with the control gates.

When increasing the vertical coupling areas between adjacent floating and control gates, it is further desirable to do so in a manner that does not increase the area of the substrate that is occupied by each cell.

SUMMARY OF THE INVENTION

According to a primary aspect of the present invention, an increased floating gate vertical surface area is provided on a projection from a base element that interfaces with the substrate surface, wherein the projection is much smaller in one direction than the base and preferably the same size as the base in the other direction. The control gate that interfaces with the vertical surfaces of the floating gate projection, with an inter-gate dielectric layer therebetween, can be positioned within the area of the floating gate base, thereby not causing the area the memory cell to be increased as a result. And the base can still be made with dimensions across the substrate surface equal to the minimum resolvable element size for the process being used.

The floating gate is shaped, according to one specific configuration, as an inverted "T", as viewed across the length of a memory cell channel between its source and drain regions. A thin base portion of the minimum element size is positioned over the substrate with gate dielectric therebetween, and a thinner portion projects upward from the base in its middle. This projection preferably extends completely across the base in an orthogonal direction, across the width of the channel, thereby to provide a significant amount of vertical surface area for coupling with a control gate that is positioned adjacent the surfaces of the projection through an inter-gate dielectric layer. The control gate wraps over the projection but need not extend beyond the base in a direction of the length of the channel.

According to another specific example, a further element is added to the top of the floating gate projection that is parallel with the base, thereby forming a floating gate in the shape of an "H" rotated 90 degrees, as viewed in a direction of the memory cell channel length. The control gate then extends through the floating gate between the base and the top element, on both sides of the vertical projection, with an inter-gate dielectric layer therebetween. The interface between the top element and the control gate adds to the coupling area between the floating and control gates.

According to another aspect of the present invention, for a different type of memory cell that erases its floating gate to an erase gate instead of to the substrate, the floating gate is provided with a base and narrow projection as described above, except that the projection need not be made to extend very high. An erase gate wraps around the projection with a suitable tunnel dielectric therebetween. The sharp edges on the top of the projection enhance tunneling of electrons from the floating gate to the erase gate through the intermediate dielectric.

The forgoing structures and techniques are extensions of those described in U.S. patent application Ser. No. 09/925, 102, filed Aug. 8, 2001. They are also related to those described in U.S. patent application Ser. No. 09/667,344, filed Sep. 22, 2000. These applications are expressly incorporated herein in their entirety by this reference.

Additional aspects, advantages and features of the present invention are included in the following description of these detailed examples, which description should be taken in conjunction with the accompanying drawings.

BRIEF DESCRIPTION OF THE DRAWINGS

FIG. 1 illustrates in block diagram form a flash EEPROM system in which the various aspects of the present invention may be implemented;

FIG. 2 is an exemplary plan view of a dual floating gate memory cell array that incorporates the present invention;

FIGS. 3A and 3B are cross-sections taken across sections II-II and I-I, respectively, of the array of FIG. 2, showing an intermediate structure that occurs during processing according to a first example that forms the array of FIG. 2;

FIG. 4 is a cross-section taken across section I-I of the array of FIG. 2, showing another intermediate structure that occurs during processing according to a fist example that forms the array of FIG. 2;

FIG. 5 is a cross-section taken across section I-I of the array of FIG. 2, showing a further intermediate structure that occurs during processing according to a fist example that forms the array of FIG. 2;

FIGS. 6A and 6B are cross-sections taken across sections I-I and II-II, respectively, of the array of FIG. 2, showing yet another intermediate structure that occurs during processing according to a first example that forms the array of FIG. 2;

FIG. 7 is a cross-section taken across section I-I of the array of FIG. 2, showing still another intermediate structure that occurs during processing according to a fist example that forms the array of FIG. 2;

FIG. 8 is a cross-section taken across section I-I of the array of FIG. 2, showing a first example of a structure that results from the processing illustrated in FIGS. 3-8;

FIG. 9 is an isometric view of a floating gate and a control gate that are coupled together in the manner of the structure of FIG. 8;

FIG. 10 is a cross-sectional view of a second memory cell example, shown as a modification of the first example view shown in FIG. 7; and FIG. 11 is a cross-sectional view of a third memory cell example, shown as a modification of the first example view shown in FIG. 7.

DESCRIPTION OF EXEMPLARY EMBODIMENTS

An example memory system incorporating the various aspects of the present invention is generally illustrated in the block diagram of FIG. 1. A large number of individually addressable memory cells 11 are arranged in a regular array of rows and columns, although other physical arrangements of cells are certainly possible. Bit lines, designated herein to extend along columns of the array 11 of cells, are electrically connected with a bit line decoder and driver circuit 13 through lines 15. Word lines, which are designated in this description to extend along rows of the array 11 of cells, are electrically connected through lines 17 to a word line decoder and driver circuit 19. Steering gates, which extend along columns of memory cells in the array 11, are electrically connected to a steering gate decoder and driver circuit 21 through lines 23. Each of the decoders 13, 19 and 21 receives memory cell addresses over a bus 25 from a memory controller 27. The decoder and driving circuits are also connected to the controller 27 over respective control and status signal lines 29, 31 and 33. Voltages applied to the steering gates and bit lines are coordinated through a bus 22 that interconnects the decoder and driver circuits 13 and 21.

The controller 27 is connectable through lines 35 to a host device (not shown). The host may be a personal computer, notebook computer, digital camera, audio player, various other hand held electronic devices, and the like. The memory system of FIG. 1 will commonly be implemented in a card according to one of several existing physical and electrical standards, such as one from the PCMCIA, the CompactFlash™ Association, the MMC™ Association, and others. When in a card format, the lines 35 terminate in a connector on the card that interfaces with a complementary connector of the host device. The electrical interface of many cards follows the ATA standard, wherein the memory system appears to the host as if it was a magnetic disk drive. Other memory card interface standards also exist. As an alternative to the card format, a memory system of the type shown in FIG. 1 may be permanently embedded in the host device.

The decoder and driver circuits 13, 19 and 21 generate appropriate voltages in their respective lines of the array 11, as addressed over the bus 25, according to control signals in respective control and status lines 29, 31 and 33, to execute programming, reading and erasing functions. Any status signals, including voltage levels and other array parameters, are provided by the array 11 to the controller 27 over the same control and status lines 29, 31 and 33. A plurality of sense amplifiers within the circuit 13 receive current or voltage levels that are indicative of the states of addressed memory cells within the array 11, and provides the controller 27 with information about those states over lines 41 during a read operation. A large number of sense amplifiers are usually used in order to be able to read the states of a large number of memory cells in parallel. During reading and program operations, one row of cells is typically addressed at a time through the circuits 19 for accessing a number of cells in the addressed row that are selected by the circuits 13 and 21. During an erase operation, all cells in each of many rows are typically addressed together as a block for simultaneous erasure.

Operation of a memory system such as illustrated in FIG. 1 is further described in patents identified in the Background section above, and in other patents assigned to SanDisk Corporation, assignee of the present application. In addition, U.S. patent application Ser. No. 09/793,370, filed Feb. 26, 2001, describes a data programming method, which application is incorporated herein by this reference.

A plan view of an example memory cell array 11 is shown in FIG. 2, wherein a small part of its repetitive structure of conductive elements are illustrated with little detail of dielectric layers that exist therebetween. A usual silicon substrate 45 includes a uniform, preferably substantially planar, top surface 47 (shown in FIGS. 3+). Elongated diffusions 49, 51 and 53 are formed in the substrate 45 through the surface 47 by an initial ion implantation and subsequent diffusion, and serve as sources and drains of the memory cells formed between them. In order to provide a convention for this description, the diffusions are shown to be spaced apart in a first x-direction, with lengths extending in a second y-direction, these first and second directions being essentially orthogonal with each other.

A large number of floating gates are included across the substrate surface 47 with suitable gate dielectric therebetween, in an array of rows and columns. One row of floating gates 55-60 is adjacent to and parallel with another row of floating gates 62-67, for example. The floating gates are shown cross-sectioned in FIG. 2, a base of each floating gate occupying the area shown and with a different cross section pattern indicating an upward projection of each floating gate. These upward projections are narrower than the base in the x-direction and the same dimension as the base in the y-direction, in a specific example. A column of floating gates 69, 64, 57 and 71 is adjacent to and parallel with a column of floating gates 73, 65, 58 and 75. The floating gates are preferably formed from conductively doped polycrystalline silicon ("polysilicon"). The source and drain diffusions 49, 51 and 53 may extend continuously in the y-direction across a large number of rows of floating gates.

The bit line decoder and driver circuit 13 (FIG. 1) is connected through lines 15 with all of the bit line source/drain diffusions of the array, including the diffusions 49, 51 and 53 of FIG. 2. The sources and drains of columns of individual memory cells are connected to proper programming voltages for either reading or programming in response to addresses supplied over the bus 25 and control signals over the lines 19.

In the example memory array in which the present invention is being described, two types of control gates are utilized, steering gates and word lines. Steering gates 77-82, one for each column of floating gates, are elongated in the y-direction and have widths in the x-direction that are coextensive with the widths of the floating gates they cross. Both dimensions of the floating gates and the widths of the steering gates are preferably that of the minimum resolvable element size for the process being used. The space between any two of the steering gates in the x-direction is similarly dimensioned. The steering gates are also formed from conductively doped polysilicon, being separated from the floating gates by appropriate inter-gate (inter-polysilicon) dielectric layer. The steering gate decoder and driver circuit 21 (FIG. 1) connects though lines 23 to all the steering gates and is able to individually control their voltages in response to addresses provided on the bus 25, control signals in the lines 33, and data from the drivers and sense amplifiers 13.

Word lines 85-88 of FIG. 2 are elongated in the x-direction and extend over the steering gates with spaces between them in the y-direction that places each word line in alignment with a row of floating gates. The word lines are also formed from conductively doped polysilicon. Each word line allows selection of all the memory cells in its row for reading or writing. The select gate decoder and driver circuit 19 (FIG. 1) is connected with each word line in order to individually select one row of the cell array. Individual cells within a selected row are then enabled for reading or writing by the bit line and steering gate decoder and driver circuits 13 and 21.

Although the gates in the foregoing structure are preferably made of doped polysilicon material, other suitable electrically conductive materials may be used in place of one or more of the three polysilicon layers described. The third layer, for example, from which the word lines and select gates are formed, may be a polycide material, which is polysilicon with a conductive refractive metal silicide on its top, such as tungsten, in order to increase its conductivity. Polycides are generally not used in place of either the first or second polysilicon layers because the quality of oxide grown from a polycide is usually not satisfactory.

Not shown in FIG. 2 are metal conductor layers. Since the diffusions and polysilicon elements usually have a conductivity that is significantly less than that of metal, metal conductors are included in separate layers, with connections made to respective metal lines through any intermediate layers at periodical intervals along the lengths of the polysilicon elements and diffusions.

PRINCIPAL MEMORY CELL EXAMPLE

A primary example of the inverted "T" floating gate structure is illustrated in the cross-sectional view of FIG. 8, while a processing recipe to make that structure is illustrated in the sequential views of FIGS. 3-8. FIGS. 3A and 3B show the result of a first series of sequential processing steps, in orthogonal cross-sectional views of FIG. 2, taken at respective sections II-II and I-I. A first step is to grow a layer 101 of tunnel oxide (example thickness of 90 Å) over at least the entire surface 47 of the semiconductor substrate 45 that is to be occupied by the memory cell array. As illustrated in FIG. 3A, the memory cell array has peripheral circuits adjacent to it, and, in some cases, totally surrounding the array. The peripheral circuits include the circuits 13, 19 and 21 of the FIG. 1 system.

Next, a layer of doped polysilicon (example thickness of 500 Å) is deposed over the layer 101, later separated into strips 103-107 shown in FIGS. 3A and 3B. A layer of silicon nitride (example thickness of 2000 Å) is then deposited over the polysilicon, later separated into strips 109-113. On top of the nitride layer is deposited a layer of silicon dioxide (example thickness of 1500 Å), not shown, over the silicon nitride layer. These layers of polysilicon, silicon nitride and silicon dioxide are deposited over both the memory cell array and peripheral circuit portions of the integrated circuit.

The area of the memory cell array is then etched through a mask formed on the top of the oxide layer, which mask totally covers the area of peripheral circuits, to leave the polysilicon/ nitride strips 103/109, 104/110, 105/111, 106/112, 107/113, etc. over similarly shaped strips of gate oxide 101. Each strip is covered with the top oxide layer (not shown). After that mask is removed, another mask is formed that totally covers the area of the memory cell array but contains openings for etching through the tunnel oxide, polysilicon, silicon nitride and silicon dioxide layers, and also into the substrate 45 to form isolation trenches 121, 123, etc. (example depth of 3000 Å into the substrate) to isolate the peripheral devices. After that mask is removed, a thick layer of silicon dioxide (7000 Å, for example) is deposited over both the memory cell array and the peripheral circuit region, causing regions between the polysilicon/nitride/oxide strips and substrate trenches to be filed with oxide. The integrated circuit is then planarized by subjecting it to chemical-mechanical-polishing (CMP) in order to remove the oxide above the nitride strips 109-113. The result of these steps is shown in FIGS. 3A and 3B, wherein thick strips of isolation oxide 115-118 lie between the polysilicon/nitride strips.

A next series of steps results in the intermediate memory cell array structure of FIG. 4, which views the array of FIG. 2 from section I-I. A layer of oxide (example thickness of 1500 Å) is deposited over the planarized surface. This layer is etched through an appropriate mask to separate it into a number of strips (elongated in the y-direction) 125 that have a width of, and are separated in the x-direction by, the minimum resolution element size of the process being used. The separation between these strips is reduced by formation of dielectric spacers along edges of the strips, such as spacers 127, in the usual manner. The oxide strips 125 and spacers then form a mask through which the strips of nitride (111 FIG. 3B being one such strip) are etched to form slots, such as a slot 129, which have individual widths less than the minimum resolution element size of the process being used. These slots are equally spaced across the array in the x-direction. Since these slots are being etched through an oxide mask, the oxide spacers 115-118 (FIG. 3A) remain in tact between the nitride strips. The slots etched in the nitride strips 110-112, for example, are bounded in the y-direction on each side of the nitride strips by an adjacent two of the thick oxide isolation strips 115-118.

After these slots are formed, a second layer 131 of doped polysilicon is deposited over the entire memory array area, and into these slots to mechanically and electrically contact the underlying polysilicon strip 105, as shown in FIG. 4. After that, the structure is subjected to CMP to remove all of the second polysilicon layer and oxide mask material from above the nitride strip segments. The result is shown in FIG. 5. Vertical projections of the polysilicon strip 105 are formed that periodically spaced along its length in the x-direction and which have widths in the y-direction equal to the width of the strip 105. Of course, this occurs with each of the other polysilicon strips, including strips 103, 104, 106 and 107 of FIG. 3A.

FIGS. 6A (taken at section I-I of FIG. 2, as are FIGS. 4 and 5 just referenced) and 6B (section II-II) illustrate the result of the next series of processing steps. The remaining nitride strip segments, such as the segments 111, are first removed. This exposes the surfaces of the polysilicon strips 105 etc. and their upward projections. A next step is to form a layer 135 of inter-gate (inter-poly) dielectric on these exposed surfaces, preferably formed of three sub-layers of oxide, nitride and oxide (ONO). The portions of the layer 135 that remain after subsequent process steps about to be described are shown in FIGS. 6A and 6B. As a specific example, about 50 Å of oxide is first grown on the exposed polysilicon surfaces, about 70 Å of nitride is then deposited over that oxide, and about 50 Å of oxide is grown on the nitride.

Next, a third layer of doped polysilicon is deposited over the entire memory array region of the integrated circuit (from 1000-2000 Å thickness, for example), which fills the regions between the projections 129 etc., over the inter-gate dielectric, and extends above those projections. A layer of oxide is then deposited (about 500 Å thick, for example) over this polysilicon, and a layer of nitride deposited (about 500 Å thick, for example) over the oxide. The polysilicon/oxide/nitride structure is then etched away through an appropriate mask (not shown) to form steering gates 141-145, each capped with a remaining portion of the oxide and nitride layers 147 and 149 that were formed over the third polysilicon layer. The steering gates are positioned in the x-direction in order that each surrounds the tops and broad sides of a column of projections 129, 130 etc., because those projections become part of floating gates with which a high degree of floating/steering gate coupling is desired.

The steering gates 141-145 are each elongated in the y-direction. Since the oxide isolation strips 115-118 have the same height as the projections 129, 130 etc. from the CMP step resulting in the polarized surface illustrated in FIG. 5, the steering gates extend over the oxide isolation strips in the y-direction, between rows of memory cells. The steering gates are spaced apart in the x-direction by a distance controlled by the etch mask used to form the steering gates. Since this mask is not self-aligned with the projections 129, 130 etc., there can be some shift in the x-direction of the steering gates relative to the projections that they surround. As can be seen from FIG. 6A, a substantial amount of such relative shifting can occur without misaligning the steering gates and their mating projections. The projection 129 will remain surrounded by the steering gate 142, for example, as its relative position is shifted a distance in either direction along the x-axis. Other than this masking step, the process being described with respect to FIGS. 3-8 is a self-aligned process.

FIG. 7 illustrates the result of the next series of steps, in the same view of the array as FIGS. 4, 5 and 6A. Using the steering gates and the dielectric layers on top of the steering gates as a mask, the exposed portions of the ONO dielectric 135 (FIG. 6A) are removed by etching. Next, using the same mask, the portions of the polysilicon strips 103-107 between the steering gates are etched away.

For the specific type of memory cell being formed in this example, every other space between steering gates is masked and source and drain regions 49, 51 and 53 are then formed by implanting ions into the substrate surface 47 through the remaining spaces between steering gates. The implant mask is then removed. An implant of significantly less dose is often made, as a separate step, in the spaces between the steering gates that are masked during the source and drain implant in order to adjust the threshold of the select transistor that is included as part of each memory cell. This level of implant can initially be made to all of the exposed areas of the substrate between the steering gates, followed by a separate implant for the source and drain regions 49, 51 and 53 after the remaining regions of the select transistors are masked as above.

It is preferable, before performing these implant steps, to form dielectric on the exposed steering gate sidewalls and substrate surface. Layers 155 of inter-gate dielectric are formed on the sidewalls of the steering gates, layers 157 of select gate dielectric and layers 159 of word line/substrate isolation dielectric are formed on the substrate surface 47, preferably in a coordinated manner. In one example, a layer (120 Å thick, for example) of oxide is deposited over the entire structure, including the steering gate sidewalls and exposed substrate surface regions. It is after this step that the blanket threshold adjusting implant may be made to all of the exposed substrate regions between the steering gates.

Next, a nitride layer (example of 100 Å in thickness) is deposited over the array. This layer is then anisotropically etched away, thereby to leave nitride spacers along the sidewalls of the steering gates, while the nitride on the exposed substrate regions between the steering gates is removed. Next, the final oxide layer (example thickness of 100 Å) of an ONO dielectric structure is formed over the nitride. If the source and drain implant step is performed after this dielectric is formed, then the substrate regions between the steering gates other than those where source and drain regions are to be formed are masked and the implant takes place. After the implant, however, the final oxide layer of the dielectric is removed from the exposed substrate regions, and a thin gate dielectric (such as 50 Å thick) is grown in its place over the initial oxide layer that remains on the substrate from the first oxide layer of the ONO structure.

A next series of steps forms the conductive word lines 85-88 of FIG. 2, a cross-sectional view of the word line 87 being shown in FIG. 8. These are formed by depositing a fourth layer of doped polysilicon over the memory array, and then etching that layer through a mask (not shown) into strips with lengths extending in the x-direction along rows of floating gates.

One example of the floating gate shape and cooperative control gate structure of the present invention has been described as incorporated within a specific example of an array of non-volatile memory cells that individually have two floating gate storage elements. This and other dual floating gate structures are described in several of the patents and patent applications incorporated herein by the foregoing references. Two storage transistors and an intermediate select transistor are formed with a common channel between adjacent source and drain substrate regions. The referenced patents and patent applications also describe the use and operation of the memory cell arrays. Such a gate structure can also be applied to the other specific dual floating gate memory cell array structures that are described in these references. Further, the gate structure of the present invention can be incorporated into other types of memory cells, including a split-channel type of memory cell, an array of NAND cells, and others. The structure has an advantage whenever it is desired to have a high level of coupling between an individual floating gate and a control gate.

This coupling is illustrated by the schematic, isometric view of FIG. 9. The floating gate includes a base element 171, most commonly in a square shape with a dimension on each side that is equal to the minimum resolution element size of the process being used. The underside of the base element 171 interfaces with the substrate surface through a layer of an appropriate gate dielectric. A projection 173, part of the floating gate, rises from the base 171. The projection 173 is preferably as wide as the base 171 in a direction A but much narrower in a direction B. A surface 175 of a control gate, which directly interfaces with surfaces of the floating gate through an inter-gate dielectric layer, is shown in dashed outline. The interface area between the two gates includes both sides of the projection 173, its top and top surfaces of the base 171 on both sides of the projection 173. This can be a considerable amount of area, when compared with the area coupled to the substrate, resulting in a high coupling ratio of the floating gate with the control gate. The control gate may be in the form of a steering gate, word line, or other type, depending upon the array in which this structure is utilized.

The projection 173 is made narrow enough in the B direction to allow its position to change somewhat relative to the base 171 in that direction as a result of any likely maximum misalignment of masks used to form the base 171 and the projection 173. In the discussion above with respect to FIG.

6A, it was pointed out that the mask used to form the steering gates, and to thus establish edges of the floating gates relative to their projections, was not self-aligned with the positions of the projections along the B direction. The relative position of the projection 173 with respect to edges of the base 171 in the B direction can move within a range that allows the control gate to interface with both sides of the projection 173 and still remain within the base 171. The projection 173 cannot be positioned adjacent an edge of the base 171, for example, if the coupling area of both sides of the projection is to be utilized by a control gate that does not extend beyond those edges in the B direction. As the likely amount of misalignment increases, the width of the projection 173 relative to that of the base 171 in the B direction is decreased. A minimum width is dictated primarily by processing constraints.

An advantage of the inverse T floating gate structure shown in FIG. 9, and implemented in an array in FIG. 8, is that the coupling area is significantly increased between it and the control gate without requiring additional substrate surface area for the control gate adjacent the floating gate. The control gate fits entirely within the footprint of the base 171 in the B direction (the x-direction of FIG. 8).

SECOND MEMORY CELL EXAMPLE

FIG. 10 shows a modification of the floating gate shape illustrated in FIGS. 8 and 9, wherein elements that are counterparts to those of FIGS. 3-8 are identified by the same reference numbers but with a prime (') added. In this embodiment, an additional top element 181 is added to the top of the projection 129' in order to further increase the coupling area between the floating gate and a control gate 183. The control gate 183 is necessarily made of a different shape than those in the embodiment of FIG. 8. The width of the element 181 in the x-direction is preferably made to be slightly less than that of the base element 56' in order to allow the control gate 183 to wrap entirely around it.

The purpose of the gate shapes discussed above is to increase the coupling area between the floating and control gates. An example of where this is important is where the floating gates are erased to the substrate. A high coupling ratio in favor of the control gate allows the voltage of the floating gates to be raised to the necessary level for erasing by using a lower voltage than usual on the control gate.

THIRD MEMORY CELL EXAMPLE

In the modification of FIG. 11, a similar gate structure to that of FIGS. 8 and 9 is employed but for a different purpose. Rather than using a projection 129' for increasing the coupling area between the floating gate and a control gate 142', the projection is formed in order to obtain the two sharp edges along the top of the projection 129' that interface with the control gate 142'. The sharp edges facilitate erasing electrons from the floating gate to the control gate through a tunnel dielectric 135". For this purpose, the projection 129' need not be as high as the projection 129 (FIG. 8).

CONCLUSION

Although the invention has been described above as embodied in several different memory cell structures, it will be understood that the invention is entitled to protection within the full scope of the appended claims.

It is claimed:

1. A method of forming a nonvolatile memory array comprising:
    forming a dielectric layer extending over a substrate surface;
    forming a plurality of floating gates on the dielectric layer, each of the plurality of floating gates having an inverted-T shape in cross-section along a plane, an individual one of the plurality of floating gates has a lower portion in contact with the dielectric layer and an upper portion extending from the lower portion, the upper portion being narrower than a minimum process element size of a process used to form the nonvolatile memory array;
    forming an intergate dielectric layer; and
    forming a plurality of conductive gates that are elongated in a direction that is perpendicular to the plane, the plurality of conductive gates separated from the plurality of floating gates by the intergate dielectric layer.

2. The method of claim 1 wherein the plurality of floating gates and the plurality of conductive gates are self-aligned.

3. The method of claim 1 wherein an individual one of the plurality of conductive gates at least partially extends between neighboring ones of the plurality of floating gates.

4. The method of claim 1 wherein the lower portion has a dimension that is equal to the minimum process element size of the process used to form the nonvolatile memory array.

5. A method of forming a nonvolatile memory array comprising:
    forming dielectric layer extending over a substrate surface;
    forming a first conductive portion on the dielectric layer;
    forming a plurality of projections that extend from the first conductive portion, each of the plurality of projections in electrical contact with the first conductive portion;
    subsequently separating the first conductive portion to form a plurality of floating gates such that each of the plurality of floating gates includes a projection, each of the plurality of floating gates being wider than the projection in at least a first direction; and
    forming a plurality of conductive control gates that extend in a second direction that is perpendicular to the first direction, the plurality of conductive control gates extending at least partially between neighboring ones of the plurality of floating gates; and
    wherein each of the plurality of projections has a dimension in the first direction that is less than a minimum process element size.

6. The method of claim 5 wherein each of the plurality of projections has a dimension in the second direction that is equal to the minimum process element size.

7. The method of claim 5 wherein the plurality of conductive control gates and the plurality of floating gates are self-aligned.

8. The method of claim 5 further comprising forming an interlayer dielectric between the plurality of floating gates and the plurality of conductive control gates.

9. The method of claim 8 wherein the plurality of control gates are formed from a conductive layer that is deposited over the interlayer dielectric layer.

* * * * *